(12) United States Patent
Payne et al.

(10) Patent No.: US 7,990,188 B2
(45) Date of Patent: Aug. 2, 2011

(54) CLOCK BUFFER

(75) Inventors: Robert F. Payne, Lucas, TX (US);
Marco Corsi, Parker, TX (US);
Tien-Ling Hsieh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/017,436

(22) Filed: Jan. 31, 2011

(65) Prior Publication Data
US 2011/0121868 A1 May 26, 2011

Related U.S. Application Data

(63) Continuation of application No. 12/393,188, filed on Feb. 26, 2009, now Pat. No. 7,906,995.

(51) Int. Cl.
*H03B 1/00* (2006.01)
(52) U.S. Cl. ......................................... 327/112; 327/309
(58) Field of Classification Search .................. 327/112, 327/309
See application file for complete search history.

(56) References Cited

U.S. PATENT DOCUMENTS

| | | | | |
|---|---|---|---|---|
| 6,292,037 | B1* | 9/2001 | Itoh | 327/112 |
| 6,885,225 | B2* | 4/2005 | Ohmichi et al. | 327/112 |
| 7,724,061 | B2* | 5/2010 | Chon et al. | 327/320 |
| 7,906,995 | B2* | 3/2011 | Payne et al. | 327/112 |

* cited by examiner

*Primary Examiner* — Hai L Nguyen
(74) *Attorney, Agent, or Firm* — John J. Patti; Wade J. Brady, III; Frederick J. Telecky, Jr.

(57) ABSTRACT

An apparatus is provided. The apparatus comprises a first bipolar junction transistor (BJT) differential pair having a first BJT and a second BJT, a second BJT differential pair having a third BJT and a fourth BJT, a first clamp having a fifth BJT and a sixth BJT, and a second clamp having a seventh BJT and an eighth BJT. The collector and base of the third BJT are respectively coupled to the collector and base of the first BJT, and the collector and base of the fourth BJT are respectively coupled to the collector and base of the second BJT. The bases of first, second, third, and fourth BJTs receive an input clock signal. The emitters of the fifth and sixth BJTs are coupled to the collectors of the first and third BJTs, while the emitters of the seventh and eight BJTs are coupled to the collectors of the second and fourth BJTs. The bases of the fifth and seventh BJT are adapted to receive a low clamping voltage, and the bases of the sixth and eighth BJTs are adapted to receive a high clamping voltage. Additionally, the first and second clamps is coupled to the collectors of the first, second, third, and fourth BJTs.

15 Claims, 3 Drawing Sheets

CLOCK BUFFER

CROSS-REFERENCE TO RELATED APPLICATIONS

This application is a continuation of U.S. patent application Ser. No. 12/393,188, entitled "CLOCK BUFFER," and filed on Feb. 26, 2009, now U.S. Pat. No. 7,906,995, which is issued on Mar. 15, 2010; which is incorporated by reference for all purposes.

TECHNICAL FIELD

The invention relates generally to a clock buffer and, more particularly, to clock buffer for an analog-to-digital converter (ADC).

BACKGROUND

Clock input buffers are used in a number of applications today. Typically, these clock input buffers have a relatively high gain and drive relatively high capacitance loads, and these clock input buffers, oftentimes, have to contend with difficult situations, such as jitter. Particularly, with many high performance applications (e.g., analog-to-digital converters or ADCs), the signal-to-noise ratio or SNR at very high input frequencies is dominated by clock jitter. For these applications, the clock input to the device can be externally filtered by an extremely narrow bandpass filter that effectively reduces the clock jitter. Application of the narrow bandpass filter, though, typically results in a sine wave-like input (i.e., slow edge rates) to the clock input buffers. To compensate for these sine wave-like inputs, the clock input buffer uses the relatively high gain to "square-up" the input clock edges to reduce the affects of internal noise sources, reduce any accumulation of offset errors, and to generally provide a well-defined clock edge for timing sensitive circuits. This combination of high gain and ability to drive a load capacitance results in a circuit that consumes high power.

There are numerous conventional designs for clock input buffers. Some examples are U.S. Pat. Nos. 5,939,942; 6,650,163; 7,345,528; and 7,126,403; U.S. Patent Pre-Grant Publ. No. 2006/0091969; and Razzagh et al. "A 10-b, 1-GSample/s Track-and-Hold Amplifier Using SiGe BiCMOS Technology," IEEE Custom Integrated Circuits Conference, 2003.

The best known design, though, is U.S. Pat. No. 7,345,528 by Zanchi et al. ("Zanchi"). In particular, Zanchi employs clamps and complementary differential pairs, but Zanchi draws a static current. As a result of this configuration, the current is generally high enough to have a very high slew rate, causing higher power consumption especially when the inputs are not toggling.

Therefore, there is a need for a clock buffer with better performance characteristics.

SUMMARY

A preferred embodiment of the present invention, accordingly, provides an apparatus. The apparatus comprises a first bipolar junction transistor (BJT) differential pair having a first BJT and a second BJT; a second BJT differential pair having a third BJT and a fourth BJT, wherein the collector and base of the third BJT are respectively coupled to the collector and base of the first BJT, and wherein the collector and base of the of the fourth BJT are respectively coupled to the collector and base of the second BJT, and wherein the bases of first, second, third, and fourth BJTs receive an input clock signal; a first clamp having a fifth BJT and a sixth BJT, wherein the emitters of the fifth and sixth BJTs are coupled to the collectors of the first and third BJTs, and wherein the base of the fifth BJT is adapted to receive a low clamping voltage, and wherein the sixth BJT is adapted to receive a high clamping voltage, and wherein the first clamp is coupled to the collectors of the first, second, third, and fourth BJTs; and a second clamp having a seventh BJT and an eighth BJT, wherein the emitters of the seventh and eight BJTs are coupled to the collectors of the second and fourth BJTs, and wherein the base of the seventh BJT is adapted to receive the low clamping voltage, and wherein the eighth BJT is adapted to receive the high clamping voltage, and wherein the second clamp is coupled to the collectors of the first, second, third, and fourth BJTs.

In accordance with a preferred embodiment of the present invention, the apparatus further comprises a current source that is coupled to the emitters of the first and second BJTs.

In accordance with a preferred embodiment of the present invention, the current source further comprises a resistor that is coupled to a voltage rail; and a ninth BJT that is coupled to the resistor at its emitter, that is coupled to the emitters of the first and second BJTs at its collector, and that receives a bias voltage at its base.

In accordance with a preferred embodiment of the present invention, the apparatus further comprises a current source that is coupled to the emitters of the third and fourth BJTs.

In accordance with a preferred embodiment of the present invention, the current source further comprises: a resistor that is coupled to a voltage rail; and a ninth BJT that is coupled to the resistor at its emitter, that is coupled to the emitters of the third and fourth BJTs at its collector, and that receives a bias voltage at its base.

In accordance with a preferred embodiment of the present invention, an integrated circuit (IC) is provided. The IC comprises a clock buffer that is adapted to receive an input clock signal and generate an output clock signal, wherein the clock driver includes: a first bipolar junction transistor (BJT) differential pair having a first BJT and a second BJT; a second BJT differential pair having a third BJT and a fourth BJT, wherein the collector and base of the third BJT are respectively coupled to the collector and base of the first BJT, and wherein the collector and base of the of the fourth BJT are respectively coupled to the collector and base of the second BJT, and wherein the bases of first, second, third, and fourth BJTs receive the input clock signal, and the wherein the collectors of the first, second, third, and fourth BJTs provide the output clock signal; a first clamp having a fifth BJT and a sixth BJT, wherein the emitters of the fifth and sixth BJTs are coupled to the collectors of the first and third BJTs, and wherein the base of the fifth BJT is adapted to receive a low clamping voltage, and wherein the sixth BJT is adapted to receive a high clamping voltage, and wherein the first clamp is coupled to the collectors of the first, second, third, and fourth BJTs; and a second clamp having a seventh BJT and an eighth BJT, wherein the emitters of the seventh and eight BJTs are coupled to the collectors of the second and fourth BJTs, and wherein the base of the seventh BJT is adapted to receive the low clamping voltage, and wherein the eighth BJT is adapted to receive the high clamping voltage, and wherein the second clamp is coupled to the collectors of the first, second, third, and fourth BJTs; functional circuitry that receives the output clock signal from the clock buffer; and an analog-to-digital converter (ADC) that is adapted to receive at least one signal from the functional circuitry.

In accordance with a preferred embodiment of the present invention, a clock buffer is provided. The clock buffer comprises a first voltage rail; a second voltage rail; a first resistor that is coupled to the first voltage rail; a second resistor that is coupled to the second voltage rail; a first PNP transistor that is coupled to the first resistor at its emitter and that is adapted to receive a first bias voltage at its base; a second PNP transistor that is coupled to the collector of the first PNP transistor at its emitter; a third PNP transistor that is coupled to the collector of the first PNP transistor at its emitter; a first NPN transistor that is coupled to the second resistor at its emitter and that is adapted to receive a second bias voltage at its base; a second NPN transistor that is coupled to the collector of the first NPN transistor at its emitter, that is coupled to the base of the second PNP transistor at its base, and that is coupled to the collector of the second PNP transistor at its collector; a third NPN transistor that is coupled to the collector of the first NPN transistor at its emitter, that is coupled to the base of the third PNP transistor at its base, and that is coupled to the collector of the third PNP transistor at its collector, wherein the bases of the second and third PNP transistor and the bases of the second and third NPN transistors receive an input clock signal, and wherein the collectors of the second and third PNP transistor and the collectors of the second and third NPN transistors provide the output clock signal; a fourth NPN transistor that is coupled to the first resistor at its collector, that is coupled to the collectors of the second PNP and NPN transistors at its emitter, and that receives a low clamping voltage at its base; a fourth PNP transistor that is coupled to the second resistor at its collector, that is coupled to the collectors of the second PNP and NPN transistors at its emitter, and that receives a high clamping voltage at its base; a fifth NPN transistor that is coupled to the first resistor at its collector, that is coupled to the collectors of the third PNP and NPN transistors at its emitter, and that receives a low clamping voltage at its base; and a fifth PNP transistor that is coupled to the second resistor at its collector, that is coupled to the collectors of the third PNP and NPN transistors at its emitter, and that receives a high clamping voltage at its base.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
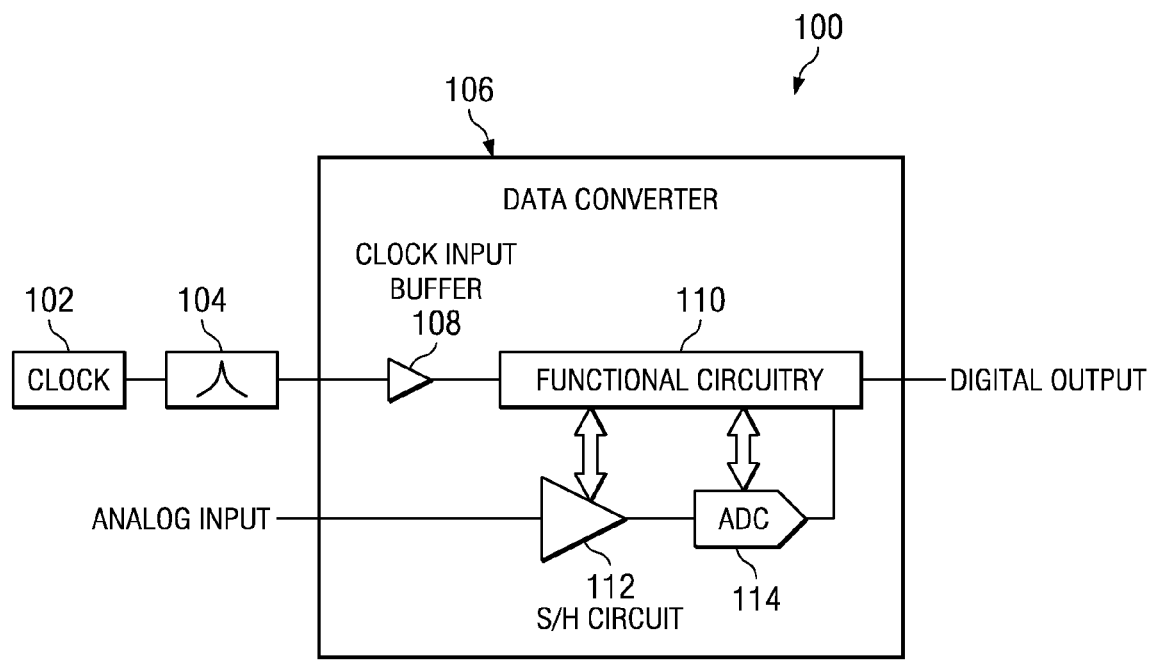
FIG. 1 is a block diagram of a system in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates a system in accordance with a preferred embodiment of the present invention. The system 100 generally comprises a clock or oscillator 100, a narrowband filter 104, and a data converter 106. Moreover, the data converter 106 generally comprises a clock input buffer 108, functional circuitry 110, a sample-and-hold (S/H) circuit 112, and an analog-to-digital converter (ADC) 114.

In operation, the data converter 106 is able to receive an analog input signal and convert it to a digital input signal across several channels. Clock 102 is able to generate a signal (which is generally in the 100 MHz to 200 MHz range). Because of the high frequency range of the analog input signal, the SNR is dominated by clock jitter. To overcome this, a narrow band filter 104 is interposed between the data converter 106 and the clock 102. The clock input buffer 108 receives the signal from the narrow band filter 104 and generates a clock signal for the functional circuitry 110. The functional circuitry 110 can then generate control signals (such as timing signals) for the S/H circuit 112 and ADC 114 so that the digital output signal can be generated from the analog input signal.

Figure 2:
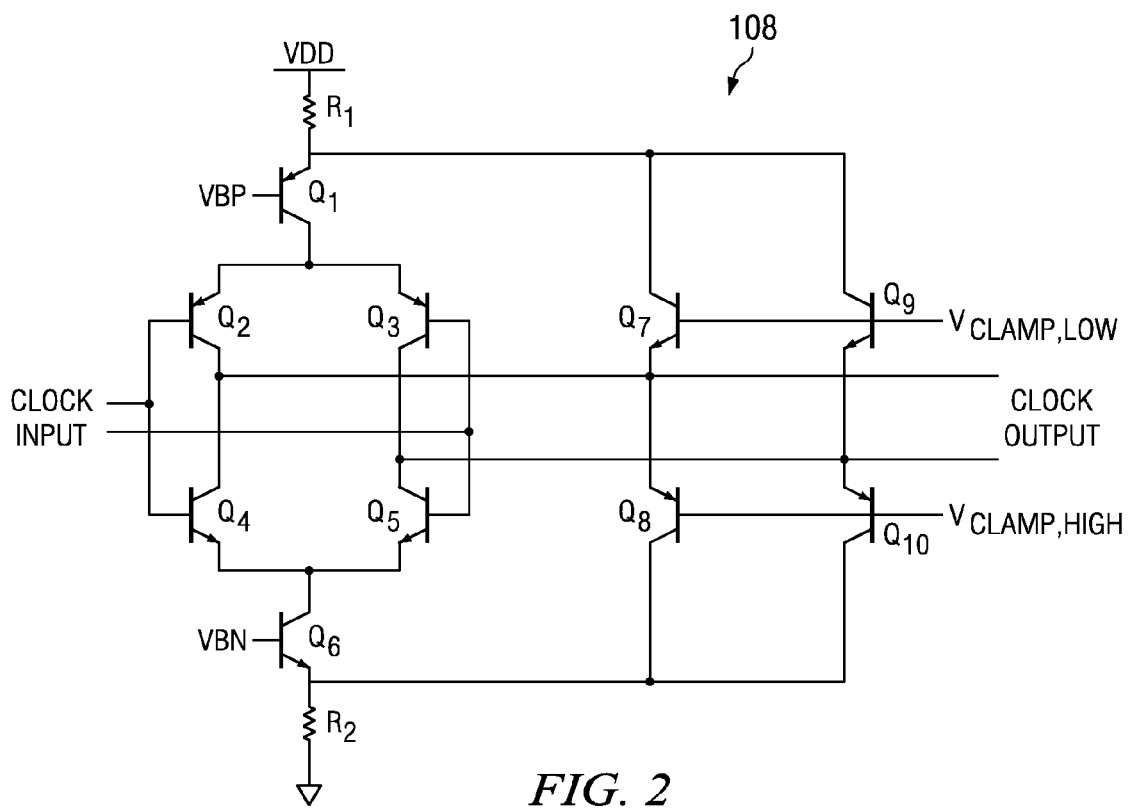
FIG. 2 is a circuit diagram of at least a portion of the input clock buffer of FIG. 1.

Turning to FIG. 2, the clock buffer 108 can be seen in greater detail. The clock buffer 108 is generally comprised of transistors Q1 through Q10 (which are preferably bipolar junction transistors or BJTs) and resistors R1 and R2. Preferably, buffer 108 includes a first current source (which is generally comprised of resistor R1 having a value of about 25Ω and transistor Q1 that is preferably a PNP transistor) that is coupled to the voltage rail VDD and a second current source (which is generally comprised of resistor R2 having a value of about 25Ω and transistor Q6 that is preferably an NPN transistor) that is coupled to a second voltage rail or ground. Each of transistors Q1 and Q6 is adapted to receive a bias voltage VBP and VBN (respectively) at their bases. Coupled to the current sources is a pair of complementary BJT differential pairs Q2 through Q5. The first differential pair Q2 and Q3 (which are preferably PNP transistors) are coupled to the collector of transistor Q1 at their emitters, while differential pair Q4 and Q5 (which are preferably NPN transistors) are coupled to the collector of transistor Q6 at their emitters. The respective bases of transistors Q2 and Q4 and bases of transistors Q3 and Q3 are coupled to one another and receive a clock input signal.

Coupled between resistors R1 and R2 are clamps Q7 through Q10. Preferably, one clamp is generally comprised of transistor Q7 (which is preferably an NPN transistor and which is coupled to resistor R1 at its collector and to the collectors of transistors Q2 and Q4 at its emitter) and transistor Q8 (which is preferably an PNP transistor and which is coupled to resistor R2 at its collector and to the collectors of transistors Q2 and Q4 at its emitter). Preferably, the other clamp is generally comprised of transistor Q9 (which is preferably an NPN transistor and which is coupled to resistor R1 at its collector and to the collectors of transistors Q3 and Q5 at its emitter) and transistor Q10 (which is preferably an PNP transistor and which is coupled to resistor R2 at its collector and to the collectors of transistors Q3 and Q5 at its emitter). Each of transistors Q7 and Q9 are adapted to receive a low clamping voltage $V_{CLAMP, LOW}$ at their bases, while each of transistors Q8 and Q10 are adapted to receive a high clamping voltage $V_{CLAMP, HIGH}$ at their bases. The emitters of transistors Q7 through Q10 can then output the clock output signal.

In operation, the differential pairs Q2 through Q5 and clamps Q7 through Q10 operate to have a high gain, but with reduced power consumption. Preferably, the clamps Q7 through Q10 are coupled to the output nodes and generally provide the proper output voltage swing levels. Essentially, these clamps Q7 through Q10 allow the clock input buffer to "see" a high impedance load such that the gain is very high and the output edge rate is the slew rate as generally defined by the current in the buffer 108 divided by the load capacitance, similar to U.S. Pat. No. 7,345,528. However, clamps Q7 through Q10 of buffer 108 are coupled to back to the emitters of transistors Q2 through Q5, which reduces power consumption when the inputs or bases of transistors Q2 through Q5 are not toggling.

Figure 3A:
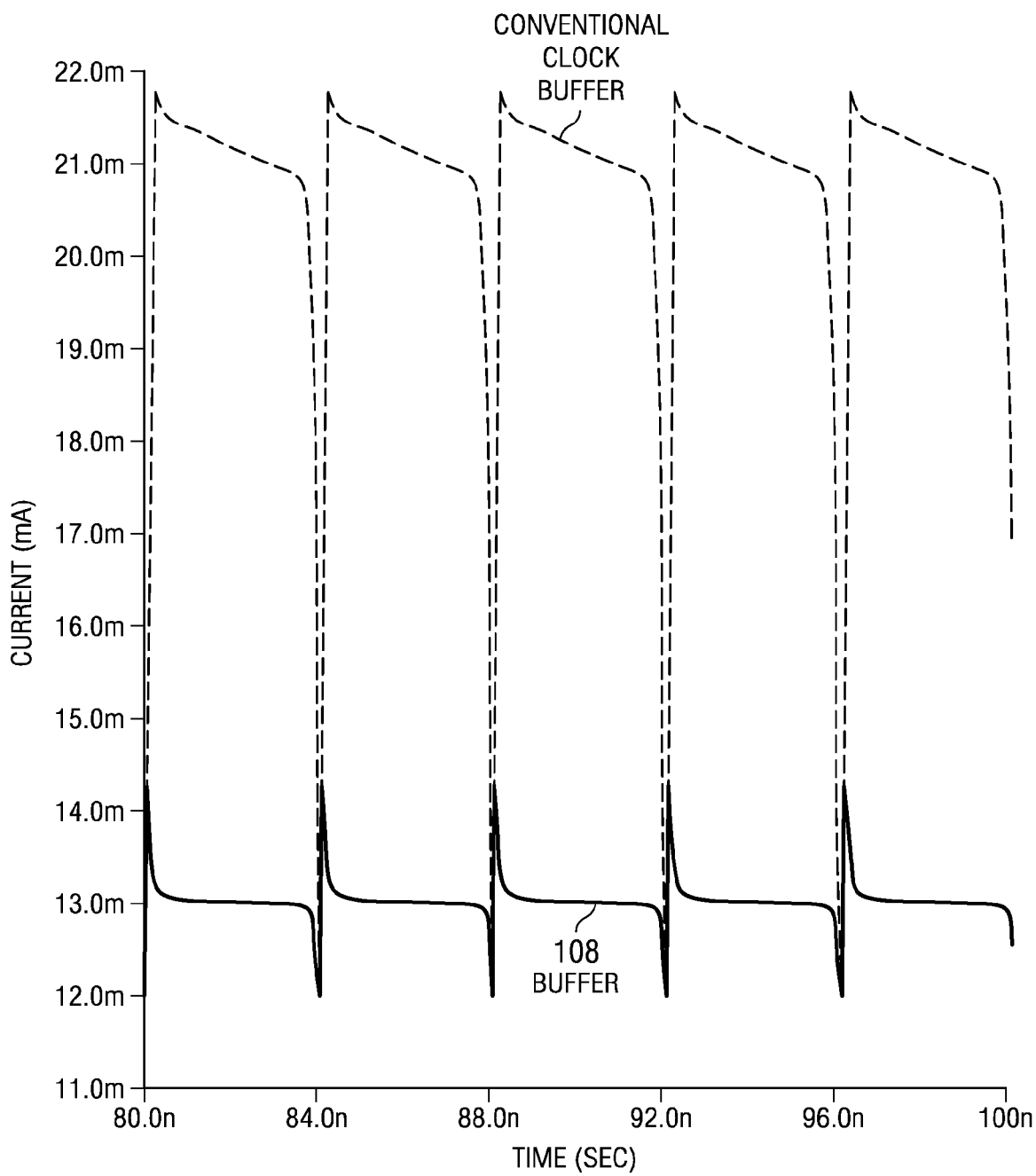
FIG. 3A is a graph depicting the current consumed by a clock buffer in accordance with a preferred embodiment of the present invention and the current consumed by a conventional clock buffer.
Figure 3B:
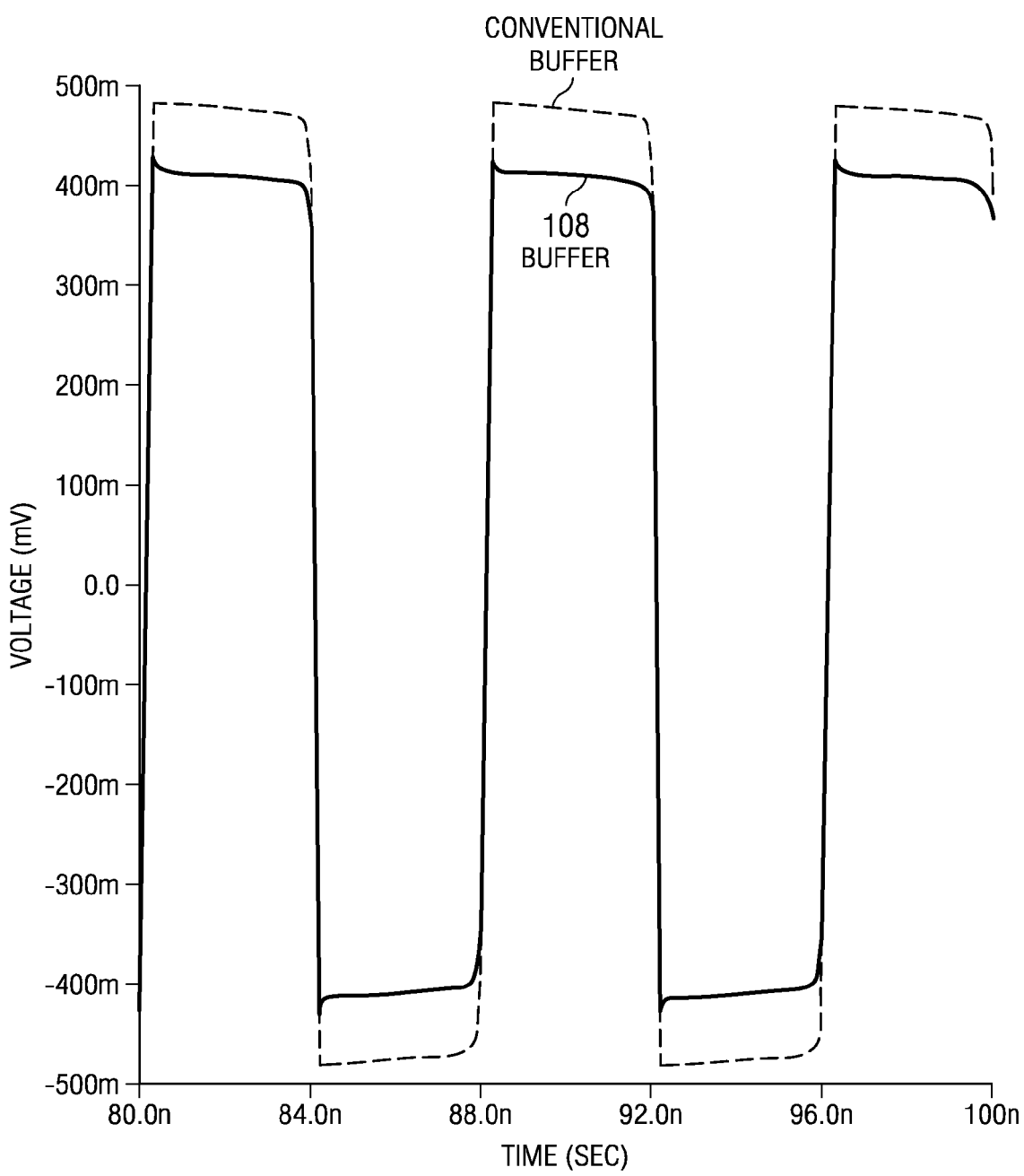
FIG. 3B is a graph depicting the output signal amplitude of a clock buffer in accordance with a preferred embodiment of the present invention and the output signal amplitude of a conventional clock buffer.

As can be seen from the graphs of FIGS. 3A and 3B, power consumption of buffer 108 is reduced because high current draws occur during an edge. In FIG. 3A, the current consumed by a conventional buffer and by buffer 108 are shown, and as can be seen, the buffer 108 consumes about 40% less current than a conventional buffer. Also, in FIG. 3B, the output signal amplitude of a conventional buffer and buffer 108 are shown, and as can be seen, the output signal amplitude of buffer 108 is about 86% of the output signal amplitude of a conventional buffer. Therefore, buffer 108 has a net gain in efficiency as compared to a conventional buffer.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first output node;
   a second output node;
   a first supply rail;
   a second supply rail
   a first current source that is coupled to the first supply rail;
   a second current source that is coupled to the second supply rail;
   a first differential pair that receives a clock signal and that is coupled to the first output node, the second output node, and the first current source;
   a second differential pair that receives the clock signal and that is coupled to the first output node, the second output node, and the second current source;
   a first clamp that is coupled to between the first and second current sources, that is coupled to the first output node, and that is adapted to receive a low clamping voltage and a high clamping voltage; and
   a second clamp that is coupled to between the first and second current sources, that is coupled to the second output node, and that is adapted to receive the low clamping voltage and the high clamping voltage.

2. The apparatus of claim 1, wherein the first current source further comprises:
   a resistor that is coupled to the first supply rail, the first clamp, and the second clamp; and
   a bias transistor that is coupled between the resistor and the first differential pair.

3. The apparatus of claim 2, wherein the resistor and the bias transistor further comprise a first resistor and a first bias transistor, respectively, and wherein the second current source further comprises:
   a second resistor that is coupled to the second supply rail, the first clamp, and the second clamp; and
   a second bias transistor that is coupled between the second resistor and the second differential pair.

4. The apparatus of claim 3, wherein the first differential pair further comprises:
   a first transistor having a first passive electrode, a second passive electrode, and a control electrode, wherein the first passive electrode of the first transistor is coupled to the first bias transistor, and wherein the second passive electrode of the first transistor is coupled to the first output node, and wherein the control electrode of the first transistor receives the clock signal; and
   a second transistor having a first passive electrode, a second passive electrode, and a control electrode, wherein the first passive electrode of the second transistor is coupled to the first bias transistor, and wherein the second passive electrode of the second transistor is coupled to the second output node, and wherein the control electrode of the second transistor receives the clock signal.

5. The apparatus of claim 4, wherein the second differential pair further comprises:
   a third transistor having a first passive electrode, a second passive electrode, and a control electrode, wherein the first passive electrode of the third transistor is coupled to the second bias transistor, and wherein the second passive electrode of the third transistor is coupled to the first output node, and wherein the control electrode of the third transistor receives the clock signal; and
   a fourth transistor having a first passive electrode, a second passive electrode, and a control electrode, wherein the first passive electrode of the fourth transistor is coupled to the first bias transistor, and wherein the second passive electrode of the fourth transistor is coupled to the second output node, and wherein the control electrode of the fourth transistor receives the clock signal.

6. The apparatus of claim 5, wherein the first, second, third, and fourth transistors are bipolar transistors.

7. The apparatus of claim 3, wherein the first clamp further comprises:
   a first transistor having a first passive electrode, a second passive electrode, and a control electrode, wherein the first passive electrode of the first transistor is coupled to the first resistor, and wherein the second passive electrode of the first transistor is coupled to the first output node, and wherein the control electrode of the first transistor receives the low clamping voltage; and
   a second transistor having a first passive electrode, a second passive electrode, and a control electrode, wherein the first passive electrode of the second transistor is coupled to the second resistor, and wherein the second passive electrode of the second transistor is coupled to the first output node, and wherein the control electrode of the second transistor receives the high clamping voltage.

8. The apparatus of claim 7, wherein the second clamp further comprises:
   a third transistor having a first passive electrode, a second passive electrode, and a control electrode, wherein the first passive electrode of the third transistor is coupled to the first resistor, and wherein the second passive electrode of the third transistor is coupled to the second output node, and wherein the control electrode of the third transistor receives the low clamping voltage; and a fourth transistor having a first passive electrode, a second passive electrode, and a control electrode, wherein the first passive electrode of the fourth transistor is coupled to the second resistor, and wherein the second passive electrode of the fourth transistor is coupled to the second output node, and wherein the control electrode of the fourth transistor receives the high clamping voltage.

9. An integrated circuit (IC) comprising:
a clock buffer that is adapted to receive an input clock signal and generate an output clock signal, wherein the clock buffer includes:
a first output node;
a second output node;
a first supply rail;
a second supply rail;
a first current source that is coupled to the first supply rail;
a second current source that is coupled to the second supply rail;
a first differential pair that receives a clock signal and that is coupled to the first output node, the second output node, and the first current source;
a second differential pair that receives the clock signal and that is coupled to the first output node, the second output node, and the second current source;
a first clamp that is coupled to between the first and second current sources, that is coupled to the first output node, and that is adapted to receive a low clamping voltage and a high clamping voltage; and
a second clamp that is coupled to between the first and second current sources, that is coupled to the second output node, and that is adapted to receive the low clamping voltage and the high clamping voltage; and
an analog-to-digital converter (ADC) that is adapted to receive at least one signal from the functional circuitry.

10. The apparatus of claim 9, wherein the first current source further comprises:
a resistor that is coupled to the first supply rail, the first clamp, and the second clamp; and
a bias transistor that is coupled between the resistor and the first differential pair.

11. The apparatus of claim 10, wherein the resistor and the bias transistor further comprise a first resistor and a first bias transistor, respectively, and wherein the second current source further comprises:
a second resistor that is coupled to the second supply rail, the first clamp, and the second clamp; and
a second bias transistor that is coupled between the second resistor and the second differential pair.

12. The apparatus of claim 11, wherein the first differential pair further comprises:
a first transistor having a first passive electrode, a second passive electrode, and a control electrode, wherein the first passive electrode of the first transistor is coupled to the first bias transistor, and wherein the second passive electrode of the first transistor is coupled to the first output node, and wherein the control electrode of the first transistor receives the clock signal; and a second transistor having a first passive electrode, a second passive electrode, and a control electrode, wherein the first passive electrode of the second transistor is coupled to the first bias transistor, and wherein the second passive electrode of the second transistor is coupled to the second output node, and wherein the control electrode of the second transistor receives the clock signal.

13. The apparatus of claim 12, wherein the second differential pair further comprises:
a third transistor having a first passive electrode, a second passive electrode, and a control electrode, wherein the first passive electrode of the third transistor is coupled to the second bias transistor, and wherein the second passive electrode of the third transistor is coupled to the first output node, and wherein the control electrode of the third transistor receives the clock signal; and a fourth transistor having a first passive electrode, a second passive electrode, and a control electrode, wherein the first passive electrode of the fourth transistor is coupled to the first bias transistor, and wherein the second passive electrode of the fourth transistor is coupled to the second output node, and wherein the control electrode of the fourth transistor receives the clock signal.

14. The apparatus of claim 11, wherein the first clamp further comprises:
a first transistor having a first passive electrode, a second passive electrode, and a control electrode, wherein the first passive electrode of the first transistor is coupled to the first resistor, and wherein the second passive electrode of the first transistor is coupled to the first output node, and wherein the control electrode of the first transistor receives the low clamping voltage; and a second transistor having a first passive electrode, a second passive electrode, and a control electrode, wherein the first passive electrode of the second transistor is coupled to the second resistor, and wherein the second passive electrode of the second transistor is coupled to the first output node, and wherein the control electrode of the second transistor receives the high clamping voltage.

15. The apparatus of claim 14, wherein the second clamp further comprises:
a third transistor having a first passive electrode, a second passive electrode, and a control electrode, wherein the first passive electrode of the third transistor is coupled to the first resistor, and wherein the second passive electrode of the third transistor is coupled to the second output node, and wherein the control electrode of the third transistor receives the low clamping voltage; and a fourth transistor having a first passive electrode, a second passive electrode, and a control electrode, wherein the first passive electrode of the fourth transistor is coupled to the second resistor, and wherein the second passive electrode of the fourth transistor is coupled to the second output node, and wherein the control electrode of the fourth transistor receives the high clamping voltage.

* * * * *